United States Patent [19]

Braun et al.

[11] Patent Number: 5,289,279
[45] Date of Patent: Feb. 22, 1994

[54] VIDEO SIGNAL DATA RECODING METHOD FOR STANDARD MEMORY COMPONENTS AND APPARATUS FOR PERFOMRING THE METHOD

[75] Inventors: Bodo Braun, Munich; Erich-Johann Bayer, Freising, both of Fed. Rep. of Germany

[73] Assignee: Siemens Aktiengesellschaft, Munich, Fed. Rep. of Germany

[21] Appl. No.: 552,783

[22] Filed: Jul. 16, 1990

[30] Foreign Application Priority Data

Jul. 14, 1989 [EP] European Pat. Off. ........ 89112979.3

[51] Int. Cl.$^5$ ........................ H04N 5/907; H04N 5/14
[52] U.S. Cl. ..................................... 346/571; 345/200
[58] Field of Search ............... 358/160, 22, 21 R; 340/799, 798; 365/51, 230.01, 230.08

[56] References Cited

U.S. PATENT DOCUMENTS

| | | | |
|---|---|---|---|
| 4,951,042 | 8/1990 | Belch | 340/799 |
| 4,980,765 | 12/1990 | Kudo et al. | 358/160 |
| 5,005,012 | 4/1991 | Kanda | 340/799 X |
| 5,083,121 | 1/1992 | Nomura et al. | 340/799 |
| 5,170,251 | 12/1992 | Levy | 358/140 |

OTHER PUBLICATIONS

Technische Mitteilungen des RFZ, vol. 30, No. 4, Dec. 1986, pp. 75-78, Berlin, DDR; W. Eckardt et al: "Digitaler Stanbildspeicher für den Fernsehstudiobetrieb".
Siemens Components 26 (1988) Book 6, pp. 240-245, Manfred Bromba et al: "Featurebox 88: der nächste Schritt beim digitalen Fernsehen".

Primary Examiner—John K. Peng
Assistant Examiner—Safet Metjhic
Attorney, Agent, or Firm—Herbert L. Lerner; Laurence A. Greenberg

[57] ABSTRACT

A method for storing video signal data of at least a partial frame in standard memory components includes providing standard memory components with $2^m$ possible memory addresses, addressing b pixels with x address bits and separately addressing z lines with y address bits through picture addresses, and selecting $b<2^x$, $z<2^y$, and m, b, z, x and y as positive integers $2^m$ is selected to be as small as possible but greater than the product of b and z. The x address bits and y address bits are recoded utilizing bit combinations not occurring in the picture addresses for uniquely assigning each occurring picture address its own memory address. A circuit configuration for performing the method includes a memory device having memory address input terminals for addressing $2^m$ possible memory addresses, a data input terminal, and a data output terminal. A control device assigns picture addresses to video signal data and controls memorization of the video signal data. The control device has picture address terminals carrying picture addresses with separate x address bits for pixel addressing and y address bits for line addressing. A recoding apparatus is connected between the picture address terminals and the memory address input terminals for uniquely assigning each picture address its own memory address. A device is provided for reading out video signal data from the memory device.

12 Claims, 4 Drawing Sheets

FIG 3
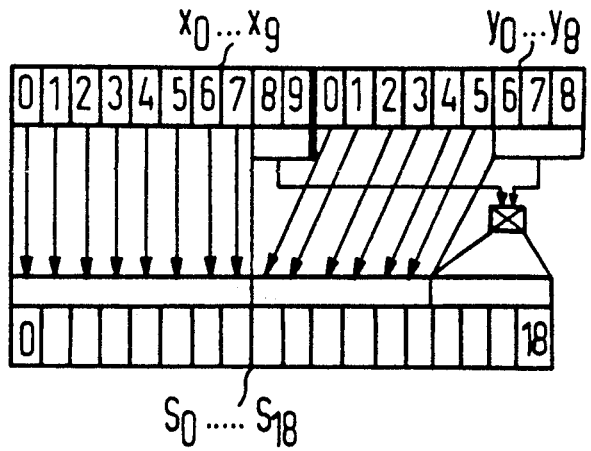
FIG 4
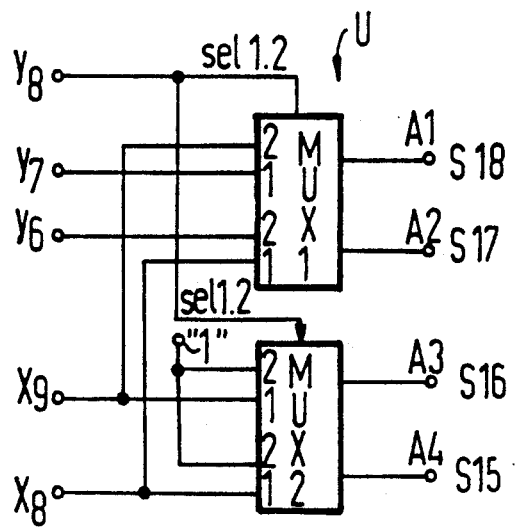
FIG 5

FIG 6
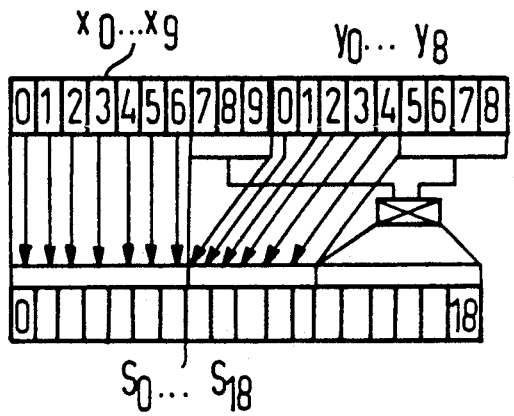
FIG 7
| $Y_8$ $Y_7$ $Y_6$ $Y_5$ $X_9$ $X_8$ $X_7$ | $S_{18}$ $S_{17}$ $S_{16}$ $S_{15}$ $S_{14}$ $S_{13}$ | AX |
|---|---|---|
| 0 $\;Y_7\;Y_6\;Y_5\;X_9\;X_8\;X_7$ | $Y_7\;Y_6\;Y_5\;X_9\;X_8\;X_7$ | $(X_9, X_8, X_7) \neq (1,1,1)$ |
| 1 $\;\;0\;\;\;0\;\;\;0\;\;X_9\;X_8\;X_7$ | $X_9\;X_8\;X_7\;\;1\;\;\;1\;\;\;1$ | $(Y_7, Y_6, Y_5) = (0,0,0)$ |
FIG 8
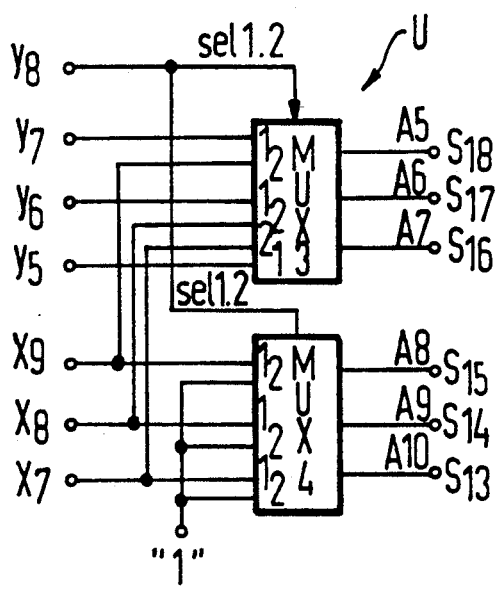

VIDEO SIGNAL DATA RECODING METHOD FOR STANDARD MEMORY COMPONENTS AND APPARATUS FOR PERFOMRING THE METHOD

BACKGROUND OF THE INVENTION

Field of the Invention

The invention relates to a method and apparatus for storing video signal data of at least a partial frame in standard memory components having $2^m$ possible memory addresses, wherein b pixels are addressed by x address bits and z lines are separately addressed by y addressed bits through picture addresses, on the condition that $b<2^x$, $z<2^y$ and m, b, z, x and y are positive integers.

The storage of video signal data is becoming increasingly important. The publication Siemens Components 26, 1988, No. 6, pages 240 through 245, for instance, discloses a digital television concept in which the central component is a memory device for storing video signal data of the television picture. Through the use of such a memory device it is possible, for instance, to inscribe the arriving video signal data into the memory device and read them out twice, at double speed. That doubles the vertical and horizontal frequencies, as a result of which the previously familiar large area flickering on the screen can be completely eliminated. It is also possible with the memory device to provide television receivers with noise suppression, cross-color reduction and features such as on-screen insets, 9-image split screens and zoom, among others.

Current memory applications for video signals use scanning rasters with b points per line and z lines, where b and z are generally not powers of 2. Nevertheless, the data are memorized in such a way that separate addressing of the pixels and picture lines by address counters is possible. The following memory provisions are conceivable:

a) the use of special memory components with line and column organization adapted to the scanning raster of the video signal;

b) the use of standard memory components, at the cost of an overly large memory capacity; and c) reducing the video information to a format tailored to the memory organization of standard memory components.

While the use of special memory components with line and column organization adapted to the scanning raster additionally requires memory components adapted to video signal data storage, thus making such components expensive, the provision listed in item c above is advantageous to the extent that standard memory components can be used. However, the video information must be tailored to the memory organization of the standard memory component, which necessarily results in a reduction in video information. If standard memory components are nevertheless to be used, without accepting a reduction in video information, then previously it was only possible to use standard memory components, with an overly large memory capacity. In order to store a frame having 768 pixels and 320 lines with separate pixel and line addressing, one or more standard memory components had to be used, with a total memory organization of 1024 columns and 512 lines. That results in a considerable unused address region. Such a frame is described in greater detail below in the description of the drawings.

SUMMARY OF THE INVENTION

It is accordingly an object of the invention to provide a method for storing video signal data and an apparatus for performing the method, which overcome the hereinaforementioned disadvantages of the heretofore-known methods and devices of this general type, with which better utilization of the physical memory space of standard memory components is attained.

With the foregoing and other objects in view there is provided, in accordance with the invention, a method for storing video signal data of at least a partial frame in standard memory components, which comprises providing standard memory components with $2^m$ possible memory addresses; addressing b pixels with x address bits and separately addressing z lines with y address bits through picture addresses; selecting $b<2^x$; selecting $z<2^y$; selecting m, b, z, x and y as positive integers; selecting $2^m$ as small as possible but greater than the product of b and z; and recoding the x address bits and y address bits utilizing bit combinations not occurring in the picture addresses for uniquely assigning each occurring picture address its own memory address.

In accordance with another mode of the invention, there is provided a method which comprises performing the recoding step with an image matrix.

In accordance with a further mode of the invention, there is provided a method which comprises controlling the recoding step with at least one bit of the x address bits or y address bits.

In accordance with an added mode of the invention, there is provided a method which comprises recoding only s address bits of the first x address bits and r address bits of the second y address bits into p address bits of the memory addresses, and selecting: $s<x$, $r<y$, and $p<s+r$.

In accordance with an additional mode of the invention, there is provided a method which comprises serially multiplexing video signal data.

In accordance with yet another mode of the invention, there is provided a method which comprises storing at least 768 pixels per line and at least 288 lines in memory.

In accordance with yet a further mode of the invention, there is provided a method which comprises storing a half frame in memory.

In accordance with yet an added mode of the invention, there is provided a method which comprises storing a full frame in memory.

In accordance with yet an additional mode of the invention, there is provided a method which comprises storing video signal data with bit plane interlacing, and selecting a number of memory words per line approximately from a number of data words per line, multiplied by a ratio between a data word width and a memory word width.

With the objects of the invention in view there is also provided a circuit configuration for storing video signal data of at least a partial frame in standard memory components having $2^m$ possible memory addresses, comprising a memory device having memory address input terminals for addressing $2^m$ possible memory addresses, a data input terminal, and a data output terminal; a control device for assigning picture addresses to video signal data and controlling memorization of the video signal data, the control device having picture address terminals carrying picture addresses with separate x address bits for pixel addressing and second y address bits for line addressing; a recoding apparatus connected between the picture address terminals and the memory address input terminals for uniquely assigning each picture address its own memory address; and means for reading out video signal data from the memory device.

In accordance with a concomitant feature of the invention, the recoding apparatus has multiplexers being controlled by at least one bit of the picture addresses.

The method for storing video signal data according to the invention is accordingly based on at least partly recoding the x address bits for the pixels and y address bits for the lines in such a way that while the number of lines and pixels per line are taken into account, as is appropriate for video signals, the fullest possible utilization of the memory volume of standard memory components is attained. Since the pixels and lines are selected to be less than a power of 2, each picture address can be uniquely assigned its own memory address, by using the bit combinations of the picture addresses that do not occur.

Other features which are considered as characteristic for the invention are set forth in the appended claims.

Although the invention is illustrated and described herein as embodied in a method for storing video signal data and an apparatus for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 3 is a diagram of a possible address recoding of FIG. 2;

FIG. 4 is an image matrix for performing the recoding of FIGS. 2 and 3;

FIG. 5 is a schematic circuit diagram of a recoding apparatus of FIGS. 3 and 4, having multiplexers being controlled by one picture address bit;

FIG. 6 is a diagram of a possible address recoding in the storage of frames having 288 lines and 896 pixels;

FIG. 7 is a possible image matrix of FIG. 6;

FIG. 8 is a circuit diagram of a recoding apparatus of FIG. 7 having multiplexers controlled by one picture address bit;

DESCRIPTION OF THE PREFERRED EMBODIMENTS

Figure 1:
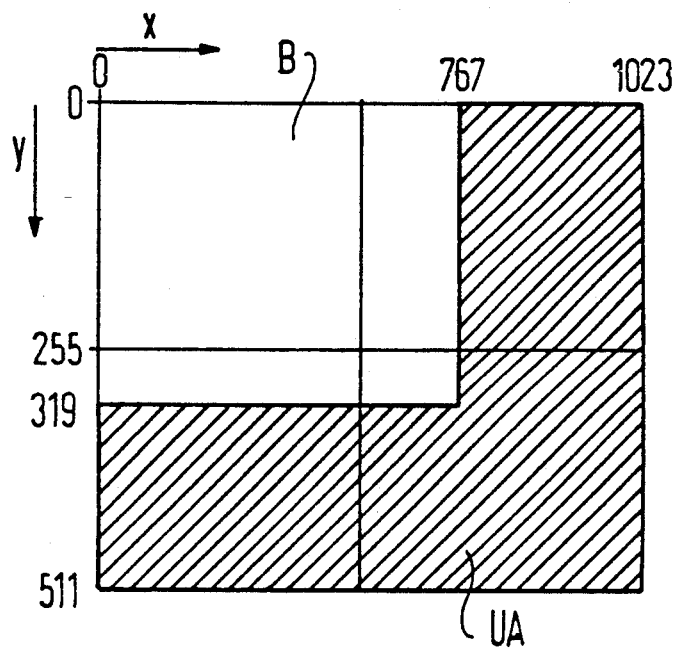
FIG. 1 is a diagrammatic illustration of a frame to be stored having 768 pixels and 320 picture lines.

Referring now to the figures of the drawing in detail and first, particularly, to FIG. 1 thereof, there is seen an example of a frame B having 768 pixels and 320 lines to be stored. In order to store this frame B, with separate pixel and line addressing, one or more standard memory components must be used, with a total memory organization of 1024 columns and 512 lines. An unused address region UA, which is shaded in FIG. 1, is of considerable size.

Figure 2:
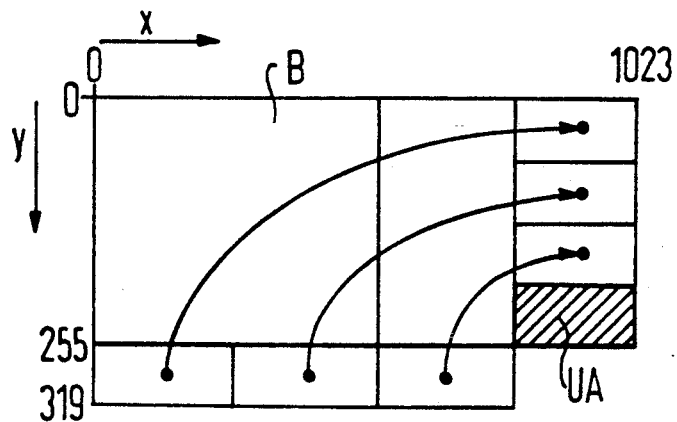
FIG. 2 is a basic diagrammatic illustration of the method according to the invention for storage of a frame as shown in FIG. 1.

FIG. 2 illustrates the method according to the invention for storing video signal data by way of example for a standard memory component having $2^m$ possible memory addresses. If it is assumed that a partial or full frame B as in FIG. 1 is to be memorized or stored, in other words 768 pixels and 320 picture lines, then according to the invention the number $2^m$ must be selected to be as small as possible, yet greater than the product of the number of pixels and the number of picture lines. Since the product of the number of pixels b and the number of picture lines z is equal to 245,760, then in accordance with the invention, m=18 must be selected. This necessitates a memory component having $2^{18}$=262,144 possible memory addresses. This standard memory component is suitably organized in 1024 columns and 256 lines.

Separate addressing of the 768 pixels by 10 address bits for the 768 column addresses in the frame and of the 320 lines by 9 address bits for the 320 line addresses in the frame is necessary in this exemplary embodiment, the number of pixels is less than $2^{10}$ and the number of lines is less than $2^9$. It is therefore possible in accordance with the invention to recode the 10 address bits and 9 address bits, utilizing the bit combinations that do not occur, in such a manner that each picture address is assigned its own memory address of the standard memory. This is diagrammatically illustrated in FIG. 1 by the fact that the video signal data from line 256 onward are inscribed into the thus-far unused memory location of the standard memory component, or in other words in the still-free memory space beyond the 768th column. The memory space UA that is still unused at the end is again shaded in FIG. 2. A comparison of the shaded unused address regions in FIGS. 1 and 2 clearly shows that better and thus more efficient utilization of the memory space of standard memory components can be achieved by recoding the picture addresses. By comparison with FIG. 1, a standard memory component or components having half the memory capacity are adequate for frame memorization or storage in FIG. 2.

FIG. 3 shows a possible address recoding for the exemplary embodiment of FIG. 2. The recoding of x address bits $x_0 \ldots x_9$ and y address bits $y_0 \ldots y_8$ is effected by utilizing the bit combinations that do not occur in the picture addresses. As will be explained below in conjunction with FIG. 4, the recoding of the x address bits and y address bits is effected for only some of the x address bits and some of the y address bits. In this exemplary embodiment, the two address bits $x_8$ and $x_9$ of the x address bits, and the three address bits $y_6$, $y_7$ and $y_8$ of the y address bits, are recoded into four address bits $s_{15}$, $s_{16}$, $s_{17}$ and $s_{18}$ of the memory addresses $s_0 \ldots s_{18}$. The memory address bits $s_0$ through $s_7$ correspond to the picture address bits $x_0$ through $x_7$, and the memory address bits $s_8$ through $s_{14}$ correspond to the picture address bits $y_0$ through $y_5$, as represented by connecting lines in FIG. 3. The picture addresses including a total of 19 bits are thus recoded into 18-bit memory addresses.

FIG. 4 shows a possible image matrix AX for performing the method according to the invention, for a frame as shown in FIGS. 2 and 3. Since the frame or partial frame has only 768 pixels, by definition the address bits $x_8$ and $x_9$ can never simultaneously become one. For the y address bits for picture line addressing, it is true that if an address bit $y_8 = 1$ does occur, then the remaining y address bits $y_0$ through $y_7$ must always be less than or equal to 63. Thus the address bits $y_7$ and $y_6$ of the y address bits, which must be equal to 0, remain freely available and can be used for the address bits $x_9$ and $x_8$. The resultant image matrix AX is shown in FIG. 4 in the form of its image specification.

FIG. 5 shows a recoding apparatus U for the image matrix AX of FIG. 4. The recoding apparatus U has first multiplexers MUX1 being controlled by the address bit $y_8$, and second multiplexers MUX2. The first and second multiplexers MUX1, MUX2 each have two reversing switches being controllable by the address bit $y_8$, and the address bits $s_{18}$ through $s_{15}$ of the memory addresses can be picked up at output terminals A1 through A4 of the reversing switches. The input terminals of the first multiplexers MUX1 and the second multiplexers MUX2 are connected to lines for the address bits $y_8$, $y_7$, $y_6$, $x_9$ and $x_8$, as shown in the image matrix in FIG. 4, or in other words are applied to logical 1. If the address bit $y_8$ is 0, for instance, then the memory address bit $s_{18}$ that corresponds to the address bit $y_7$ is present at the first output terminal A1 of the recoding apparatus. However, if the address bit $y_8$ is 1, then the logical value corresponding to the address $s_9$ is present at the output terminal A1, and so forth.

If the image matrix AX shown in FIG. 4 is known, then it is no problem whatsoever for one skilled in the art to provide the appropriate circuitry, so that a detailed illustration in this connection can be dispensed with.

In FIGS. 6, 7 and 8 which are explained below, the method according to the invention is described in connection with a frame to be stored having 288 lines and 896 pixels. According to the invention, $m = 18$ must accordingly be selected. Thus the same memory component as that described for FIG. 2 can be used. One possible recoding of the picture addresses is shown in FIG. 6. Recoding of both the address bits $x_7$, $x_8$, $x_9$ and the address bits $y_5$, $y_6$, $y_7$ and $y_8$ is presented. These seven address bits are recoded into six memory address bits $s_{13}$ through $s_{18}$.

The image matrix AX for this can be seen in FIG. 7. In this process the following information on the picture addresses is utilized: The address bits $x_9$, $x_8$ and $x_7$ can never simultaneously become 1. If the address bit $y_8$ is equal to 1, then the address bits $y_7$, $y_6$ and $y_5$ are equal to 0. The address bits $y_7$, $y_8$ and $y_5$ can therefore be used for the address bits $x_9$, $x_8$ and $x_7$. The resultant image matrix AX has the image specification shown in FIG. 7.

FIG. 8 shows a possible recoding apparatus for the image matrix AX of FIG. 7. This recoding apparatus U has a third multiplexer MUX3 and a fourth multiplexer MUX4, each of which has three output terminals A5, A6, A7 and A8, A9 and A10, respectively, at which the memory address bits $s_{18}$ through $s_{13}$ can be picked up. The third multiplexer MUX3 and fourth multiplexer MUX4 each have three reversing switch devices, which switch over from the address bit $y_8$, depending on its logical value. The address bit $y_7$ and the address bit $x_9$ are connected to the first input terminals of the first reversing switch device of the third multiplexer MUX3. The address bits $y_6$ and $x_8$ are connected to the input terminals of a second reversing switch device of the third multiplexer MUX3, while the input terminals of the third reversing switch device of the third multiplexer MUX3 are connected to the address bits $y_5$ and $x_7$. The address bits $x_9$, $x_8$ and $x_7$ are each connected to a respective input terminal of the three reversing switch devices of the fourth multiplexer MUX4, and a logical 1 can be applied to the other input terminals of each of these devices. If the address bit $y_8$ is logical 0, then the memory addresses $s_{18}$ through $s_{13}$ that can be picked up at the output terminals A1 through A6 of the recoding device U of FIG. 8 correspond to the address bits $y_7$, $y_6$, $y_5$, $x_9$, $x_8$ and $x_7$. In contrast, if the address bit $y_8$ that effects the control of the reversing switch is logical 1, then the memory address bits $s_{13}$, $s_{14}$ and $s_{15}$ become equal to 1, and the memory address bits $s_{16}$, $s_{17}$ and $s_{18}$ become $x_7$, $x_8$ and $x_9$ respectively. This provides a unique recoding of the picture addresses into the memory addresses. Since the same image matrix can be used both for the inscription and for the readout of the video signal data, or for readout from the standard memory, then providing the inverse image matrix, which projects the memory addresses onto the picture addresses, becomes unnecessary.

With this process of recoding the picture addresses into memory addresses according to the invention, it is simple to make efficient use of standard memory components. In order to construct the image matrix as simply as possible, it is practical but not absolutely necessary to select the number of pixels and lines of the picture in the form of a difference or sum of powers of 2, as has been the case in the above examples ($768 = 2^{10} - 2^8$; $320 = 2^8 + 2^6$; $896 = 2^{10} - 2^7$ and $288 = 2^8 + 2^5$). However, other realizations may provide 928 x addresses and 282 y addresses, as an example.

Another embodiment of the invention provides the inscription of the video signal data into the standard memory component with bit plane interlacing. This is particularly advantageous for efficient utilization of the physical memory space if the data word width of the video signal data does not match the memory word width of the standard memory component. For instance, if the video signal data are organized in 7-bit words and the standard memory has 8-bit memory words, then 9 times 7 bit data words are inscribed in 8 times 8 bit memory words. It can be stated in general that for efficient utilization of the physical memory space, the number of memory words per line is selected approximately from the number of data words per line, multiplied by the ratio between the data word width and the memory word width.

Figure 9:
FIG. 9 is an illustration of serially multiplexed video signal data, which are present in a 4:1:1 address format.

If the video signal data are in the form of serially multiplexed components, for instance as a YUV signal (Y = luminance; UV = chrominance), then the method according to the invention can again be used. One possible address format, shown in FIG. 9, is 4:1:1, as an example. In other words, the scanning frequency for the luminance signal Y is selected to be 4 times higher than the scanning frequency for the chrominance signals U and V. The scanning frequency for the luminance signal Y may, for instance, be 13.5 MHz, and for the chrominance signals U and V, it can be 3.375 MHz. For the components Y, U and V, either one joint memory or separate memories may be used. In the latter case, with 7-bit resolution per component, a memory having a total of 2 megabits is sufficient.

Figure 10:
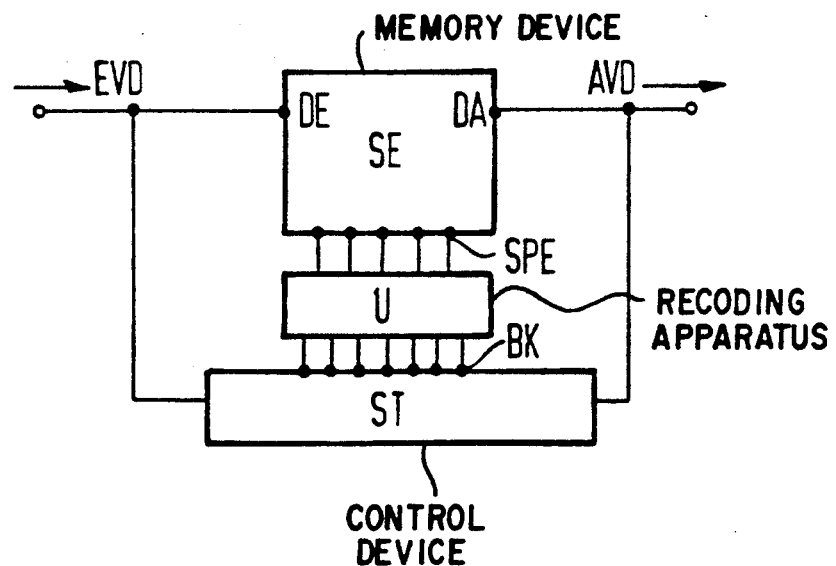
FIG. 10 is a block circuit diagram of a circuit configuration according to the invention for storing video signal data.

FIG. 10 shows the fundamental circuit diagram for a circuit configuration for performing the method of the invention. The circuit configuration has at least one memory apparatus SE with memory address input terminals SPE for addressing $2^m$ possible memory addresses, as well as a data input terminal DE and a data output terminal DA. Video signals EVD to be stored reach the data input terminal DE of the memory apparatus SPE through a feed line. Video signal data AVD that can be read out of the memory apparatus SE can be picked up at the data output terminal DA. Both the storage of the video signal data EVD and the readout of the stored data are possible through a control device ST. To this end, picture addresses that can be picked up at picture address terminals BK are assigned to the video signal data EVD by the control device ST. These picture addresses include x address bits for the column addresses in the frame and, separately from them, y address bits for the line addresses in the frame. When the video signal data EVD are read into the memory device SE, they are assigned the associated picture addresses through the control device ST. Each picture address can be uniquely assigned its own memory address through a recoding apparatus U that has already been explained in detail in connection with FIGS. 5 and 8. To this end, the recoding apparatus U is connected between the picture address terminals BK and the memory address input terminals SPE. The memorized video signal data are read out by once again assigning picture addresses to the stored video signal data, recoding these addresses into memory addresses, and finally reading them out with correct synchronization.

We claim:

1. Method for storing video signal data of at least a partial frame in standard memory components, which comprises providing standard memory components with $2^m$ possible memory addresses; addressing b pixels with x address bits and separately addressing z lines with y address bits through picture addresses; selecting $b < 2^x$; selecting $z < 2^y$; selecting m, b, z, x and y as positive integers; selecting $2^m$ as small as possible but greater than the product of b and z; and recoding the x address bits and y address bits utilizing bit combinations not occurring in the picture addresses for uniquely assigning each occurring picture address its own memory address.

2. Method according to claim 1, which comprises performing the recoding step with an image matrix.

3. Method according to claim 1, which comprises controlling the recoding step with at least one bit from the group of the x and y address bits.

4. Method according to claim 1, which comprises recoding only s address bits of the x address bits and r address bits of the y address bits into p address bits of the memory addresses, selecting s, r and p as positive integers, and selecting: $s < x$, $r < y$, and $p < s + r$.

5. Method according to claim 1, which comprises serially multiplexing the video signal data.

6. Method according to claim 1, which comprises storing, at least 768 pixels per line and at least 288 lines in the standard memory.

7. Method according to claim 1, which comprises storing a half frame in the standard memory.

8. Method according to claim 1, which comprises storing a full frame in the standard memory.

9. Method according to claim 1, which comprises storing video signal data with bit plane interlacing, and selecting a number of memory words per line approximately from a number of data words per line, multiplied by a ratio between a data word width and a memory word width.

10. Circuit configuration for storing video signal data of at least a partial frame in standard memory components having $2^m$ possible memory addresses, comprising:
    a memory device having memory address input terminals for addressing $2^m$ possible memory addresses, a data input terminal, and a data output terminal;
    a control device for assigning picture addresses to video signal data and controlling memorization of the video signal data, said control device having picture address terminals carrying picture addresses with separate x address bits for pixel addressing and y address bits for line addressing;
    a recoding apparatus connected between said picture address terminals and said memory address input terminals for uniquely assigning each picture address its own memory address; and
    means for reading out video signal data from said memory device.

11. Circuit configuration of claim 10, wherein said recoding apparatus has multiplexers being controlled by at least one bit of the picture addresses.

12. Method for storing video signal data of at least a partial frame in standard memory components, which comprises providing standard memory components with $2^m$ possible memory addresses; addressing b pixels with x address bits through picture addresses; selecting $b < 2^x$; selecting $z < 2^y$; selecting m, b, z, x and y as positive integers; selecting $2^m$ as small as possible but greater than the product of b and z; recoding a address bits of the x address bits and r address bits of the y address bits into p address bits of the memory addresses utilizing bit combinations not occurring in the picture addresses for uniquely assigning each occurring picture address its own memory address, and selecting: $s < x$ and $r < y$ and $p < s + r$ and selecting s, r, and p as positive integers.

* * * * *